United States Patent
Chen et al.

(10) Patent No.: US 8,674,479 B2
(45) Date of Patent: Mar. 18, 2014

(54) METHOD FOR PRODUCING MIM CAPACITORS WITH HIGH K DIELECTRIC MATERIALS AND NON-NOBLE ELECTRODES

(71) Applicants: Intermolecular, Inc., San Jose, CA (US); Elpida Memory, Inc., Tokyo (JP)

(72) Inventors: Hanhong Chen, Milpitas, CA (US); Pragati Kumar, Santa Clara, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 13/902,679

(22) Filed: May 24, 2013

(65) Prior Publication Data

US 2013/0285205 A1    Oct. 31, 2013

Related U.S. Application Data

(63) Continuation of application No. 13/032,739, filed on Feb. 23, 2011, now Pat. No. 8,481,384.

(51) Int. Cl.
*H01L 21/302* (2006.01)

(52) U.S. Cl.
USPC .......................................................... 257/532

(58) Field of Classification Search
USPC ................................................. 257/532–535
See application file for complete search history.

(56) References Cited

U.S. PATENT DOCUMENTS 8,481,384 B2 *   7/2013   Chen et al. ............... 438/240

* cited by examiner

*Primary Examiner* — Richard Booth

(57) ABSTRACT

A method of producing a Metal-Insulator-Metal (MIM) capacitor stack through doping to achieve low current leakage and low equivalent oxide thickness is disclosed. A high K dielectric material is deposited on a non-noble electrode; the dielectric material is doped with oxides from group IIA. The dopant increases the barrier height of metal/insulator interface and neutralizes free electrons in dielectric material, therefore reduces the leakage current of MIM capacitor. The electrode may also be doped to increase work function while maintaining a rutile crystalline structure. The method thereby enhances the performance of DRAM MIM capacitor.

17 Claims, 5 Drawing Sheets

| DOPANT MATERIAL | CBO (eV) | VBO (eV) | METAL ION VALENCE |
|---|---|---|---|
| $Y_2O_3$ | 2.3 | 2.6 | 3+ |
| $Al_2O_3$ | 2.8 | 4.9 | 3+ |
| MgO | 3.1 | 3.5 | 2+ |
| SrO | 3.6 | 0.9 | 2+ |

| DOPANT MATERIAL | CBO (eV) | VBO (eV) | METAL ION VALENCE |
|---|---|---|---|
| $Y_2O_3$ | 2.3 | 2.6 | 3+ |
| $Al_2O_3$ | 2.8 | 4.9 | 3+ |
| MgO | 3.1 | 3.5 | 2+ |
| SrO | 3.6 | 0.9 | 2+ |

| High K Material | Metal ion Valence | Dopant Material | Dopant ion Valence | Doping Concentration |
|---|---|---|---|---|
| $TiO_2$ | 4+ | SrO, MgO, BaO | 2+ | 5% ~ 20% |
| $ZrO_2$ | 4+ | SrO, MgO, BaO | 2+ | 5% ~ 20% |
| $HfO_2$ | 4+ | SrO, MgO, BaO | 2+ | 5% ~ 20% |
| $V_2O_5$ | 5+ | SrO, MgO, BaO | 2+ | 5% ~ 20% |
| $V_2O_5$ | 5+ | $Al_2O_3$, $Y_2O_3$, $Sc_2O_3$ | 3+ | 5% ~ 20% |
| $Ta_2O_5$ | 5+ | SrO, MgO, BaO | 2+ | 5% ~ 20% |
| $Ta_2O_5$ | 5+ | $Al_2O_3$, $Y_2O_3$, $Sc_2O_3$ | 3+ | 5% ~ 20% |
| $Nb_2O_5$ | 5+ | SrO, MgO, BaO | 2+ | 5% ~ 20% |
| $Nb_2O_5$ | 5+ | $Al_2O_3$, $Y_2O_3$, $Sc_2O_3$ | 3+ | 5% ~ 20% |

FIG. 6

METHOD FOR PRODUCING MIM CAPACITORS WITH HIGH K DIELECTRIC MATERIALS AND NON-NOBLE ELECTRODES

CROSS-REFERENCE TO RELATED APPLICATIONS

This is a Continuation Application of U.S. patent application Ser. No. 13/032,739, filed on Feb. 23, 2011, which is herein incorporated by reference for all purposes.

This document relates to the subject matter of a joint research agreement between Intermolecular, Inc. and Elpida Memory, Inc.

TECHNICAL FIELD

The present invention relates to semiconductor device manufacturing processes, and more specifically to a method for producing Metal-Insulator-Metal or MIM capacitors for DRAM applications.

BACKGROUND

Dynamic Random Access Memory or DRAM uses capacitors to store bits of information within an integrated circuit. Some DRAM devices use Metal-Insulator-Metal or MIM capacitors. MIM capacitors in DRAM applications use insulating materials with a dielectric constant higher than that of $SiO_2$ (3.9), such as $HfO_2$ and $ZrO_2$, commonly referred as high K dielectric materials. Dielectric constant, or K value, is a measure of a material's ability to be polarized; polarization is closely associated with a material's ability to hold electrical charge. Therefore, the higher the dielectric constant of a material, the more electrical charge the material can hold. A capacitor's ability to hold electrical charge (capacitance) is a function of a surface area of the capacitor plates, a distance between the capacitor plates, and the dielectric constant of the insulator. Capacitors made with high K materials can be made smaller than more conventional capacitors with equivalent capacitance. Reducing the size of capacitors is important for reducing the size of integrated circuits.

As DRAM technologies scale down below 40 nm (referring to the average half-pitch of a memory cell, or half the distance between cells in a DRAM chip), manufacturers must reduce the equivalent oxide thickness of dielectric films in MIM capacitors to increase charge storage capacity. Equivalent oxide thickness or EOT is a measure of thickness of a film of silicon oxide would have to be to achieve the same effect as a film of a high K dielectric material. Manufacturers typically achieve lower equivalent oxide thickness by reducing physical dielectric film thickness.

Reducing physical film thickness leads to increased leakage current in MIM capacitors (a phenomenon where current passes through an insulator, compromising storage capacity). DRAM applications utilize MIM capacitor stacks, also known as MIM capacitors with leakage current below $1E10^{-7}$ $A/cm^2$. Leakage current in MIM capacitors using high K dielectric materials is typically dominated by either Schottky emission or Frenkel-Poole emission. Schottky emission, also called thermionic emission, is the heat induced flow of charge over an energy barrier. The effective barrier height of some MIM capacitors using high K dielectric materials with narrow energy band gaps (such as $TiO_2$ and $Nb_2O_5$) controls leakage current due to Schottky emission. Effective barrier height is a function of the difference between the work function of the electrode and the electron affinity of the dielectric. The leakage current of some other MIM capacitors using high K dielectric materials with wide energy band gaps (such as $ZrO_2$ and $HfO_2$) is dominated by Frenkel-Poole emission, which is related to leakage conduction through charge traps in the energy band gap. In either case, the leakage current of MIM capacitors can be reduced by introducing proper dopants.

Current MIM capacitors used in DRAM applications use $HfO_2$ or $ZrO_2$ as the insulating dielectric material. Manufacturers commonly dope $HfO_2$ and $ZrO_2$ with oxides that have higher conduction band offset to increase the barrier height, and/or dope the dielectric material with acceptor-type dopants to neutralize the charge traps in the dielectric material. The conventional doping method for high K materials is to dope tetravalent oxides, such as $TiO_2$, $HfO_2$ and $ZrO_2$ with trivalent oxides, such as $Al_2O_3$ and $Y_2O_3$. Some emerging materials such as $TiO_2$ have still higher K values, but lower conduction band offset than lower K materials, producing higher leakage current.

Doping $TiO_2$ with $Y_2O_3$ or $Al_2O_3$ can reduce leakage current to approximately $5E10^{-7}$ $A/cm^2$ with equivalent oxide thickness of 0.5 nm. However, reducing leakage current further by tuning the doping concentration or layering structure is difficult.

BRIEF DESCRIPTION OF THE DRAWINGS

The numerous objects and advantages of the present invention may be better understood by those skilled in the art by reference to the accompanying figures in which:

FIG. 6 depicts a chart showing electrical properties of high K materials and their corresponding dopants according to the present method as shown in FIG. 1.

DETAILED DESCRIPTION

The present invention relates to a method for processing dielectric materials and electrodes in a MIM capacitor through proper doping to reduce leakage current. MIM capacitors with reduced leakage current are useful in DRAM applications because manufacturers need smaller capacitors than can be produced by current technology to further reduce the size of integrated circuits. The scope of the invention is limited only by the claims; numerous alternatives, modifications and equivalents are encompassed. For the purpose of clarity, technical material that is known in the technical fields related to the embodiments has not been described in detail to avoid unnecessarily obscuring the description.

MIM Capacitors with High K Dielectrics on Non-Noble Electrodes

Figure 1:
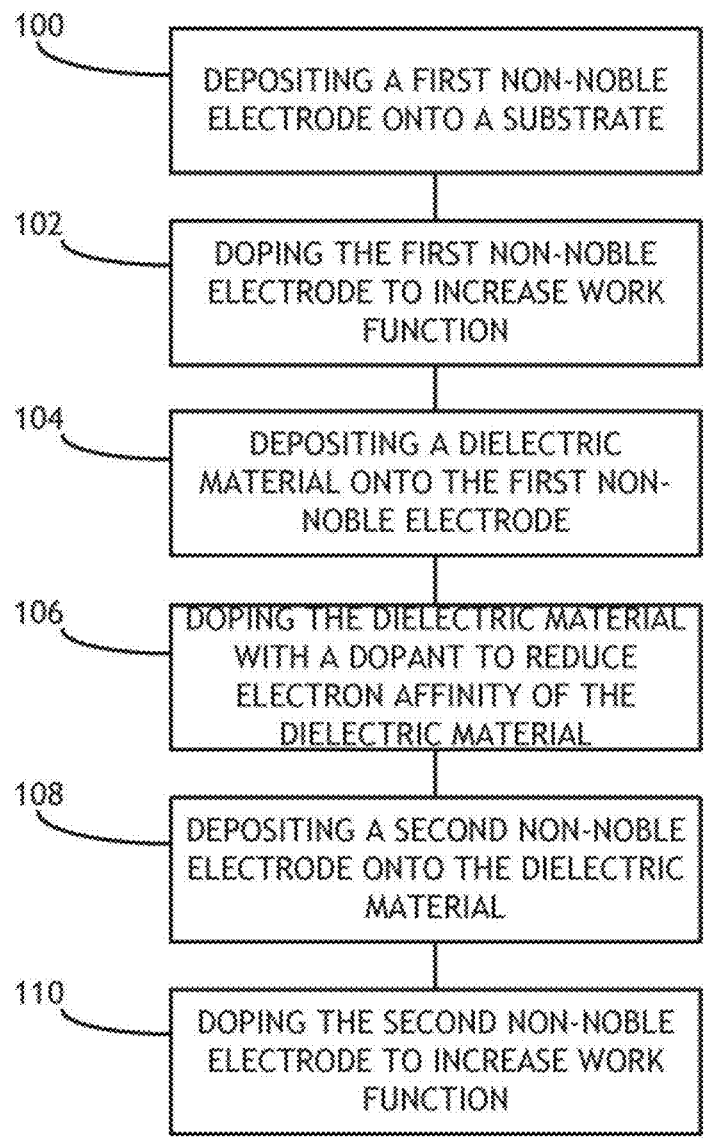
FIG. 1 depicts a flow chart of one embodiment of the present method.

Referring to FIG. 1, a flow chart of one embodiment of the present method for producing a Metal-Insulator-Metal capacitor stack is shown. In exemplary operations of the present method, a device suitable for depositing a film or layer on a substrate may deposit a first non-noble electrode onto a substrate 100. Non-noble electrodes are electrodes which include materials comprised of metals other than noble metals. For example, non-noble electrodes may be formed from molybdenum dioxide ($MoO_2$), manganese dioxide ($MnO_2$), tungsten dioxide ($WO_2$) and titanium nitride (TiN). The first non-noble electrode may be deposited by means such as atomic layer deposition (ALD), chemical vapor deposition (CVD) or physical vapor deposition (PVD). A device suitable for doping an electrode in a MIM capacitor production process may dope the first non-noble electrode with a dopant to increase work function of the non-noble electrode 102 as described below. A device suitable for depositing a film in a MIM capacitor production process may then deposit a high K dielectric material onto the non-noble electrode 104. A high K dielectric material generally refers to any material with a dielectric constant greater than 3.9 (the dielectric constant of $SiO_2$); however, MIM capacitors in DRAM applications require insulating materials with a significantly higher dielectric constant, such as $HfO_2$, $ZrO_2$ and $TiO_2$. The high K dielectric may be deposited by means such as ALD or CVD. A device suitable for doping a dielectric material in a MIM capacitor production process may dope the high K dielectric material with a dopant 106. The dopant for the dielectric may increase conduction band offset of the high K dielectric material and neutralize free electrons induced by defects in the dielectric material. MIM capacitors made with high K dielectric materials doped for increased conduction band offset, deposited on non-noble electrodes, have lower leakage current at lower EOT as compared to conventional MIM capacitors. MIM capacitors with high K dielectric materials doped for increased conduction band offset are therefore useful for producing smaller integrated circuits for DRAM applications. A device suitable for depositing a film in a MIM capacitor production process may then deposit a second non-noble electrode onto the dielectric material 108. A device suitable for doping an electrode in a MIM capacitor production process may then dope the second non-noble electrode 110 as described below. Depositing a film and doping the same film may be performed simultaneously, by the same device. Therefore, wherever the inventors have disclosed depositing a film, either depositing an electrode or a dielectric material, and doping such film, it should be appreciated that depositing and doping the film may be performed simultaneously, using ALD and CVD (for high K dielectrics and electrodes) or using PVD co-sputtering (for electrodes).

Figures 2, 3:
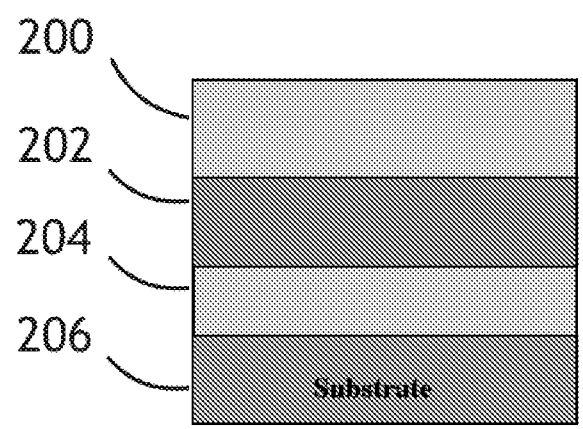
FIG. 2 depicts a cross-sectional representation of a MIM capacitor stack produced by the present method as shown in FIG. 1.
FIG. 3 depicts a chart of electrical properties of some dopant materials of group II and group III used in the method of FIG. 1.

Referring to FIG. 2, one embodiment of a MIM capacitor stack produced by the present method has a first or bottom electrode 204 applied to a substrate 206, a high K dielectric material 202 applied to the first electrode, and a second or top electrode 200 applied to the high K dielectric material. The first electrode is a non-noble metal oxide or nitride such as $MoO_2$, $MnO_2$, $WO_2$ and TiN. The high K dielectric material is a material such as $HfO_2$, $ZrO_2$ and $TiO_2$ doped with a dopant to increase conduction band offset and neutralize free electrons induced by defects. The second electrode may be a non-noble metal oxide or nitride such as $MoO_2$, $MnO_2$, $WO_2$ and TiN. Where appropriate, the first electrode or the second electrode or both may be doped to increase work function of the electrodes and thereby increase barrier height and reduce leakage current.

Increasing Work Function of the Non-Noble Electrode

In one embodiment, the first non-noble electrode comprises $MoO_2$, $MnO_2$ or $WO_2$. $MoO_2$, $MnO_2$ and $WO_2$ have rutile crystalline structures similar to rutile $TiO_2$. Rutile crystalline structure in the non-noble electrode may be advantageous for overall MIM capacitor performance as further described below. In this embodiment, a device suitable for doping an electrode in a MIM capacitor production process may dope the first non-noble electrode with high work function dopants, such as Co or Ni to increase work function of the first non-noble electrode. By properly controlling doping concentration [0~20 atomic percentage (at %)] and process conditions, the Co or Ni doped first non-noble electrode may maintain its rutile crystalline structure, but with improved work function compared to a similar non-doped non-noble electrode. It is contemplated that atomic percentage may refer to percentage of atoms of a dopant to the total amount of atoms in a doped material. Because leakage current due to Schottky emission is primarily a function of barrier height, and barrier height is a function of the difference between the work function of the electrode and the electron affinity of the dielectric, a MIM capacitor using an electrode with improved work function has a reduced current leakage as compared to a capacitor without improved work function. The second electrode may also comprise $MoO_2$, $MnO_2$ or $WO_2$. In that case, a device suitable for doping an electrode in a MIM capacitor production process may dope the second non-noble electrode with Co or Ni to increase work function of the second non-noble electrode.

The dielectric constant of some high K materials varies depending on the crystalline structure of the material; for example, the anatase crystalline phase of $TiO_2$ has a dielectric constant of 30~40 while the rutile phase of $TiO_2$ has a dielectric constant of 90~170. A non-noble electrode with rutile crystalline structure promotes growth of rutile $TiO_2$ when applied to the non-noble electrode. $TiO_2$ deposited on a non-noble electrode with rutile crystalline structure demonstrates a high K value of 80-100. For that reason, non-noble electrodes doped by the present method have both increased work function and maintain their rutile crystalline structure.

Increasing Conduction Band Offset and Neutralizing Free Electrons

Figure 4:
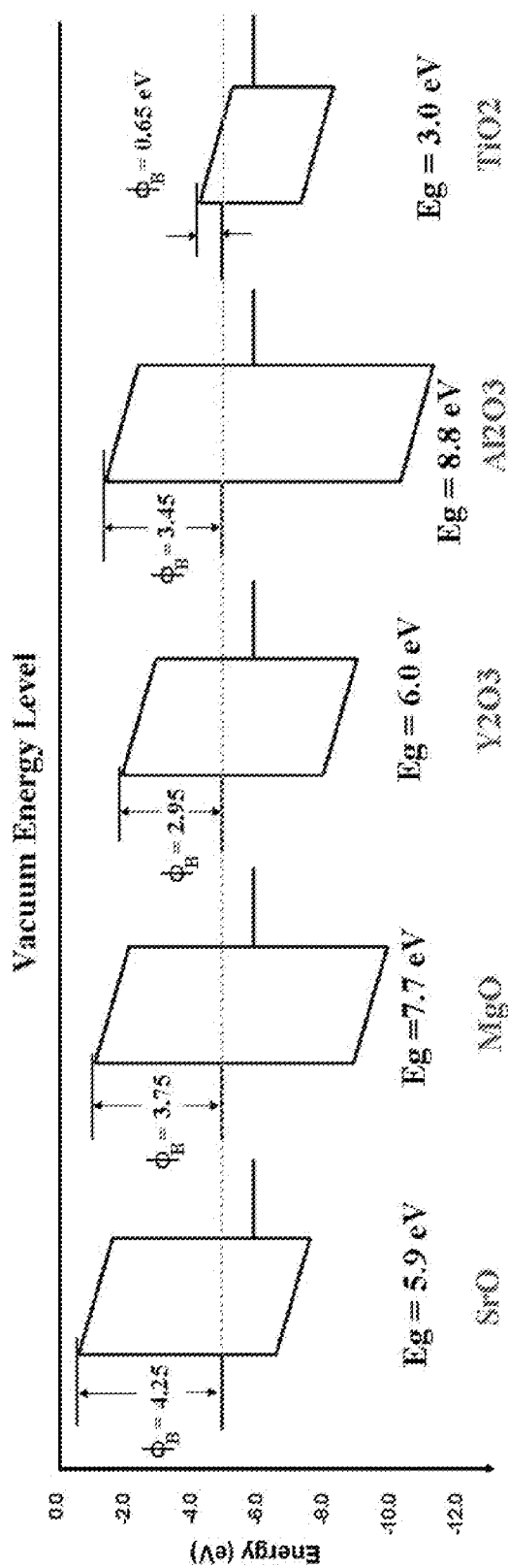
FIG. 4 depicts energy band diagrams for a $TiO_2$ dielectric and several dopants on non-noble electrodes with work function of 4.8 eV useful in implementing the present method.
Figure 5:
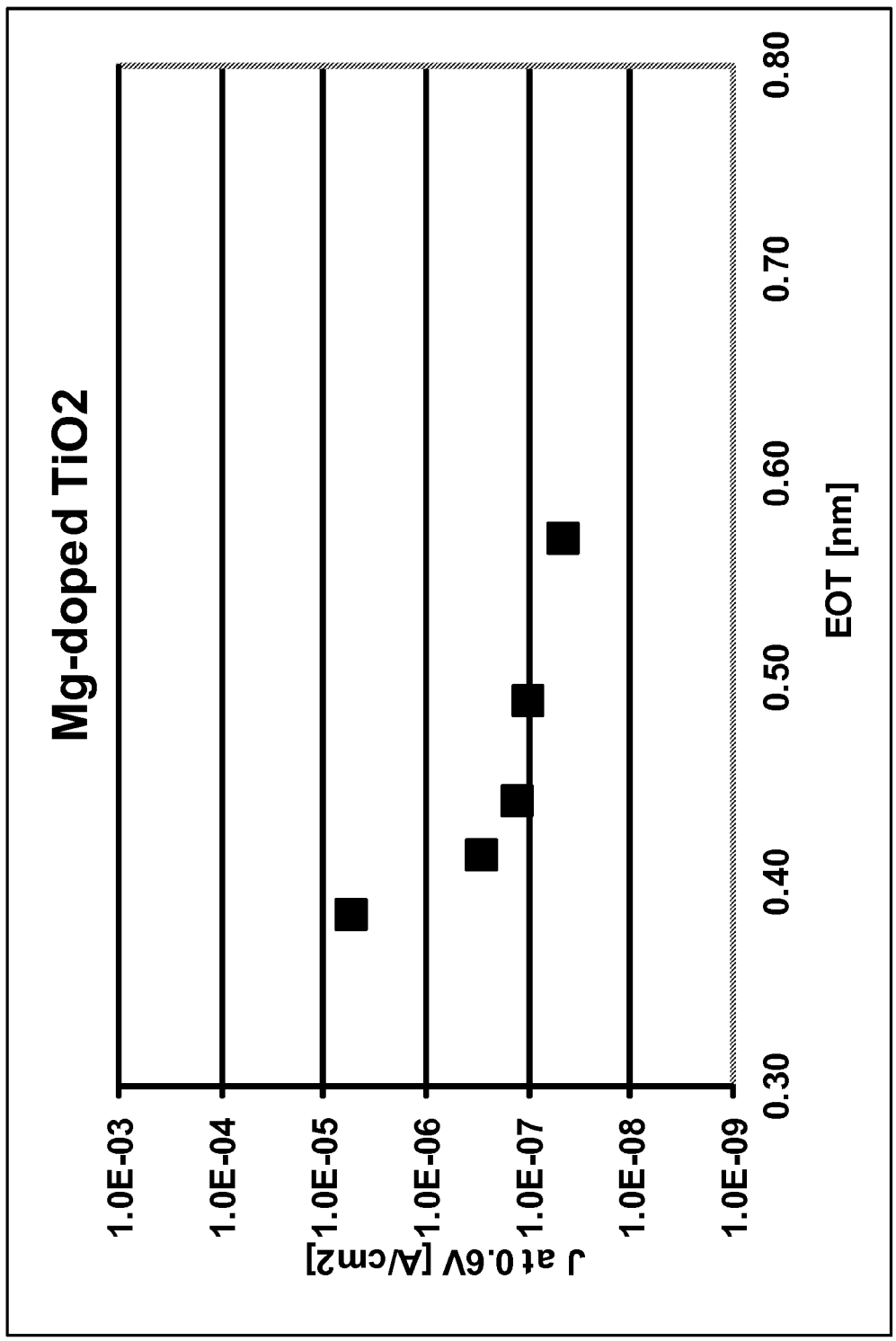
FIG. 5 depicts a leakage-EOT plot of TiO2 doped with group II dopant Mg according to the present method as shown in FIG. 1.

Referring to FIG. 3, group IIA oxides, MgO and SrO, have higher conduction band offset, or CBO, than group III oxides, $Y_2O_3$ and $Al_2O_3$. Furthermore, group IIA oxides may be more effective than group II oxides at neutralizing free electrons induced by defects in the dielectric material. Consequently, referring to FIG. 4, group IIA oxides increase barrier height and neutralizing free electrons in MIM capacitors more effectively than group III oxides and therefore are more effective at reducing leakage current. Referring to FIG. 5, Mg doped $TiO_2$ dielectric material on $MoO_2$ electrode has a leakage current of 1E-7 $A/cm^2$ at 0.6V and EOT of 0.5 nm.

Referring to FIGS. 1 and 6, in another embodiment the non-noble electrode may be TiN. TiN does not have a rutile crystalline structure. A device suitable for depositing a film in a MIM capacitor production process may deposit a dielectric material onto the non-noble electrode. The dielectric material is a tetravalent metal oxide such as $HfO_2$, $ZrO_2$ or $TiO_2$. A device suitable for doping a film in a MIM capacitor production process may dope the dielectric material, the dopant may be a bivalent metal oxide such as SrO, MgO or BaO. Compared to trivalent dopants such as $Al_2O_3$ and $Y_2O_3$, bivalent dopants such as SrO and MgO may have significantly higher conduction band offset and improve the barrier height of dielectrics in MIM capacitors more effectively, and therefore reduce leakage current more effectively. Doping concentrations for dopants may be between approximately 5 at % and 20 at %.

Still referring to FIGS. 1 and 6, in another embodiment, the dielectric material is a pentavalent metal oxide such as $V_2O_5$, $Ta_2O_5$ or $Nb_2O_5$, and the dopant is a bivalent metal oxide or a trivalent metal oxide such as SrO, MgO, BaO, $Al_2O_3$, $Y_2O_3$ or $Sc_2O_3$. Again, doping concentrations for dopants may be between approximately 5 at % and 20 at %.

Furthermore, the metal ions in group IIA oxides act as acceptors to neutralize the free carrier in n-type dielectric materials. Free carriers may reduce the performance of MIM capacitors by increasing the leakage current. When bivalent metal ions such as $Sr^{2+}$ and $Mg^{2+}$ are substituted for tetravalent metal ions such as $Hf^{4+}$, $Zr^{4+}$ and $Ti^{4+}$, one bivalent metal ion can neutralize two free electrons and is therefore more effective than trivalent ions at reducing free carriers in high K dielectric materials.

The present methods may be performed by devices ordinarily used in MIM capacitor production processes suitably configured to deposit films and dope non-noble electrodes or high K dielectric materials, or both. Specifically, the present methods may be implemented through atomic layer deposition, chemical vapor deposition, or any equivalent methodology known in the art.

It is believed that the present invention and many of its attendant advantages will be understood by the foregoing description, and it will be apparent that various changes may be made in the form, construction, and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A semiconductor layer stack comprising:
   a first electrode deposited on a substrate;
   wherein the first electrode further comprises a dopant;
   a dielectric material deposited on the first electrode; and
   a second electrode deposited on the dielectric material,
   wherein the first electrode is a non-noble electrode and comprises one of $MoO_2$, $MnO_2$, TiN, or $WO_2$, and
   wherein the dopant comprises one of Co or Ni.

2. The semiconductor layer stack of claim 1, wherein the dopant in the first electrode preserves a rutile crystalline structure of the first electrode and increases a work function of the first electrode.

3. The semiconductor layer stack of claim 2, wherein a concentration of the dopant in the first electrode is less than 20 at %.

4. The semiconductor layer stack of claim 3, wherein the second electrode comprises one of $MoO_2$, $MnO_2$, TiN, or $WO_2$.

5. The semiconductor layer stack of claim 4, wherein the second electrode further comprises a dopant, and wherein the dopant comprises with one of Co or Ni,
   wherein the dopant in the second electrode preserves a rutile crystalline structure of the second electrode and increases a work function of the second electrode.

6. The semiconductor layer stack of claim 5, wherein a concentration of the dopant in the second electrode is less than 20 at %.

7. The semiconductor layer stack of claim 1, wherein the dielectric material comprises one of $HfO_2$, $ZrO_2$, or $TiO_2$.

8. The semiconductor layer stack of claim 1, wherein the dielectric material further comprises a dopant, wherein addition of the dopant into the dielectric material increases a conduction band offset of the dielectric material and neutralizes free electrons induced by defects in the dielectric material.

9. The semiconductor layer stack of claim 1, wherein the dielectric material comprises a dopant, and wherein the dopant comprises one of SrO, MgO, BaO, $Al_2O_3$, $Y_2O_3$, or $Sc_2O_3$.

10. The semiconductor layer stack of claim 9, wherein a concentration of dopant in the dielectric material is between 5 at % and 20 at %.

11. The semiconductor layer stack of claim 1, wherein the dielectric material comprises one of $V_2O_5$, $Ta_2O_5$, or $Nb_2O_5$.

12. The semiconductor layer stack of claim 1, wherein the dielectric material comprises one of $HfO_2$, $ZrO_2$, or $TiO_2$, and wherein the dielectric material is doped with one of SrO, MgO, or BaO.

13. The semiconductor layer stack of claim 1, wherein the dielectric material comprises one of $V_2O_5$, $Ta_2O_5$, or $Nb_2O_5$, and wherein the dielectric material is doped with one of SrO, MgO, BaO, $Al_2O_3$, $Y_2O_3$, or $SC_2O_3$.

14. The semiconductor layer stack of claim 1, wherein the first electrode has a rutile crystalline phase.

15. The semiconductor layer stack of claim 14, wherein the rutile crystalline phase of the first electrode promotes deposition of the dielectric material in a crystalline rutile phase.

16. The semiconductor layer stack of claim 1, wherein the dielectric material comprises $TiO_2$ having a rutile crystalline phase.

17. The semiconductor layer stack of claim 16, wherein the dielectric material is doped with Mg.

* * * * *